(12) United States Patent
Ash et al.

(10) Patent No.: US 11,031,867 B2
(45) Date of Patent: Jun. 8, 2021

(54) DIGITAL-TO-ANALOG CONVERTER WITH EMBEDDED MINIMAL ERROR ADAPTIVE SLOPE COMPENSATION FOR DIGITAL PEAK CURRENT CONTROLLED SWITCHED MODE POWER SUPPLY

(71) Applicant: Cirrus Logic International Semiconductor Ltd., Edinburgh (GB)

(72) Inventors: Mikel Ash, Austin, TX (US); Eric J. King, Austin, TX (US); Lingli Zhang, Austin, TX (US); Graeme G. Mackay, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/202,463

(22) Filed: Nov. 28, 2018

(65) Prior Publication Data
US 2019/0181754 A1     Jun. 13, 2019

Related U.S. Application Data

(60) Provisional application No. 62/596,335, filed on Dec. 8, 2017.

(51) Int. Cl.
| | | |
|---|---|---|
| *H02M 1/00* | (2006.01) | |
| *H02M 3/157* | (2006.01) | |
| *H04R 3/00* | (2006.01) | |
| *H03M 1/06* | (2006.01) | |
| *H02M 3/158* | (2006.01) | |

(52) U.S. Cl.
CPC ......... *H02M 3/157* (2013.01); *H03M 1/0602* (2013.01); *H04R 3/00* (2013.01); *H02M 3/158* (2013.01); *H02M 2001/0025* (2013.01)

(58) Field of Classification Search
CPC .... H02M 3/156; H02M 3/157; H02M 3/1588; H02M 2001/0025; H03M 1/0602; H04R 3/00
See application file for complete search history.

(56) References Cited

U.S. PATENT DOCUMENTS

| | | | |
|---|---|---|---|
| 4,929,882 A | 5/1990 | Szepesi | |
| 4,975,820 A * | 12/1990 | Szepesi | ................ H02M 3/156 363/21.17 |
| 6,222,356 B1 | 4/2001 | Taghizadeh-Kaschani | |

(Continued)

FOREIGN PATENT DOCUMENTS

EP     2775599 A1     9/2014

OTHER PUBLICATIONS

International Search Report and Written Opinion of the International Searching Authority, International Application No. PCT/US2018/051284, dated Dec. 21, 2018.

(Continued)

*Primary Examiner* — Kyle J Moody
*Assistant Examiner* — Jyej-June Lee
(74) *Attorney, Agent, or Firm* — Jackson Walker L.L.P.

(57) ABSTRACT

A method may include controlling switching behavior of switches of a switch-mode power supply based on a desired physical quantity associated with the switch-mode power supply, wherein the desired physical quantity is based at least in part on a slope compensation signal and generating the slope compensation signal to have a compensation value of approximately zero at an end of a duty cycle of operation of the switch-mode power supply.

16 Claims, 9 Drawing Sheets

(56) References Cited

U.S. PATENT DOCUMENTS

| | | | |
|---|---|---|---|
| 7,605,574 | B2 | 10/2009 | Dearn et al. |
| 7,615,981 | B2 | 11/2009 | Wong et al. |
| 8,686,767 | B1* | 4/2014 | Nene .................. H02M 3/1588 327/142 |
| 8,937,469 | B2 | 1/2015 | Clark et al. |
| 9,712,055 | B1 | 7/2017 | Swartz et al. |
| 10,720,835 | B2 | 7/2020 | King et al. |
| 10,734,885 | B2 | 8/2020 | King et al. |
| 2006/0145675 | A1 | 7/2006 | Lee et al. |
| 2006/0238174 | A1 | 10/2006 | Russell et al. |
| 2009/0066301 | A1 | 3/2009 | Oswald et al. |
| 2011/0062932 | A1* | 3/2011 | Hawkes ............... H02M 3/156 323/288 |
| 2011/0110132 | A1 | 5/2011 | Rausch et al. |
| 2011/0204859 | A1 | 8/2011 | Prodic et al. |
| 2012/0275198 | A1 | 11/2012 | Cohen |
| 2014/0111170 | A1 | 4/2014 | Shi et al. |
| 2014/0239922 | A1* | 8/2014 | Nene .................... H02M 3/156 323/234 |
| 2014/0239935 | A1* | 8/2014 | Nene .................... H02M 3/1588 323/304 |
| 2014/0247029 | A1* | 9/2014 | Krabbenborg ........ H02M 3/156 323/282 |
| 2014/0313799 | A1* | 10/2014 | Hung ..................... H02M 3/00 363/95 |
| 2015/0022172 | A1* | 1/2015 | Hari ...................... H02M 3/156 323/282 |
| 2015/0146458 | A1 | 5/2015 | Lim |
| 2016/0006336 | A1* | 1/2016 | Bennett ................ H02M 3/156 323/271 |
| 2019/0089245 | A1* | 3/2019 | King .................... H02M 3/156 |
| 2019/0131871 | A1* | 5/2019 | Krabbenborg ........ H02M 3/156 |
| 2019/0386561 | A1* | 12/2019 | King .................... H02M 3/156 |

OTHER PUBLICATIONS

International Search Report and Written Opinion of the International Searching Authority, International Application No. PCT/US2019/037483, dated Sep. 18, 2019.

* cited by examiner

DIGITAL-TO-ANALOG CONVERTER WITH EMBEDDED MINIMAL ERROR ADAPTIVE SLOPE COMPENSATION FOR DIGITAL PEAK CURRENT CONTROLLED SWITCHED MODE POWER SUPPLY

RELATED APPLICATION

The present disclosure claims priority to U.S. Provisional Patent Application Ser. No. 62/596,335, filed Dec. 8, 2017, which is incorporated by reference herein in its entirety.

FIELD OF DISCLOSURE

The present disclosure relates in general to circuits for electronic devices, including without limitation personal audio devices such as wireless telephones and media players, and more specifically, to a digital-to-analog converter (DAC) with embedded minimal error adaptive slope compensation for a digital peak current controlled switched mode power supply.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Often, boost converters operate as peak current-controlled boost converters, wherein a main control loop of a control system is used to determine a peak current requirement on each switching phase of the boost converter in order to generate a desired boosted output voltage of the boost converter. For boost duty cycles where a duty cycle (e.g., which may be determined by subtracting an arithmetic ratio from the number one, wherein the arithmetic ratio equals the input voltage supplied to the boost converter divided by the boost output voltage of the boost converter) is greater than 50%, slope compensation circuitry may be required to avoid sub-harmonic behavior of the boost converter. Also present in many boost converter control systems is protection circuitry to ensure that the current of a boost converter is maintained below a maximum value. The detection of the peak current in accordance with the main control loop and detection of the maximum allowable current is often performed by two separate circuits: a first comparator comparing a measured current (e.g., measured current of a power inductor of the boost converter) with a slope-compensated target peak current signal and a second comparator comparing the measured current to the maximum current limit. The main control loop, which may also be known as a compensator, may generate a target peak current signal which may be modified by slope compensation circuitry, and such slope-compensated target peak current signal may be compared by the first comparator to the measured current in order to perform peak-current control of a boost converter. However, because slope compensation may occur in analog circuitry, an unknown amount of correction may exist at the point the first comparator toggles. Such error may be removed by the main control loop in regulating the boosted voltage output by the power converter.

However, for duty cycles greater than 50%, without slope compensation, unstable oscillation may occur as a result of a sub-harmonic oscillation. However, such slope compensation may negatively affect a dynamic range of a compensator digital-to-analog converter of a control loop, as described in greater detail below, because the slope compensation signal adds a varying correction term that varies with duty cycle, further complicated by the fact that duty cycle may vary significantly in operation, and further complicated by the fact that if the slope-compensation term may be non-zero at the point that inductor current $I_L$ reaches slope-compensated peak current signal $I_{PK}'$.

SUMMARY

In accordance with the teachings of the present disclosure, one or more disadvantages and problems associated with existing approaches to operating a power converter may be reduced or eliminated.

In accordance with embodiments of the present disclosure, a method may include controlling switching behavior of switches of a switch-mode power supply based on a desired physical quantity associated with the switch-mode power supply, wherein the desired physical quantity is based at least in part on a slope compensation signal and generating the slope compensation signal to have a compensation value of approximately zero at an end of a duty cycle of operation of the switch-mode power supply.

In accordance with these and other embodiments of the present disclosure, a system may include control circuitry configured to control switching behavior of switches of a switch-mode power supply based on a desired physical quantity associated with the switch-mode power supply, wherein the desired physical quantity is based at least in part on a slope compensation signal and a slope generator configured to generate the slope compensation signal to have a compensation value of approximately zero at an end of a duty cycle of operation of the switch-mode power supply.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
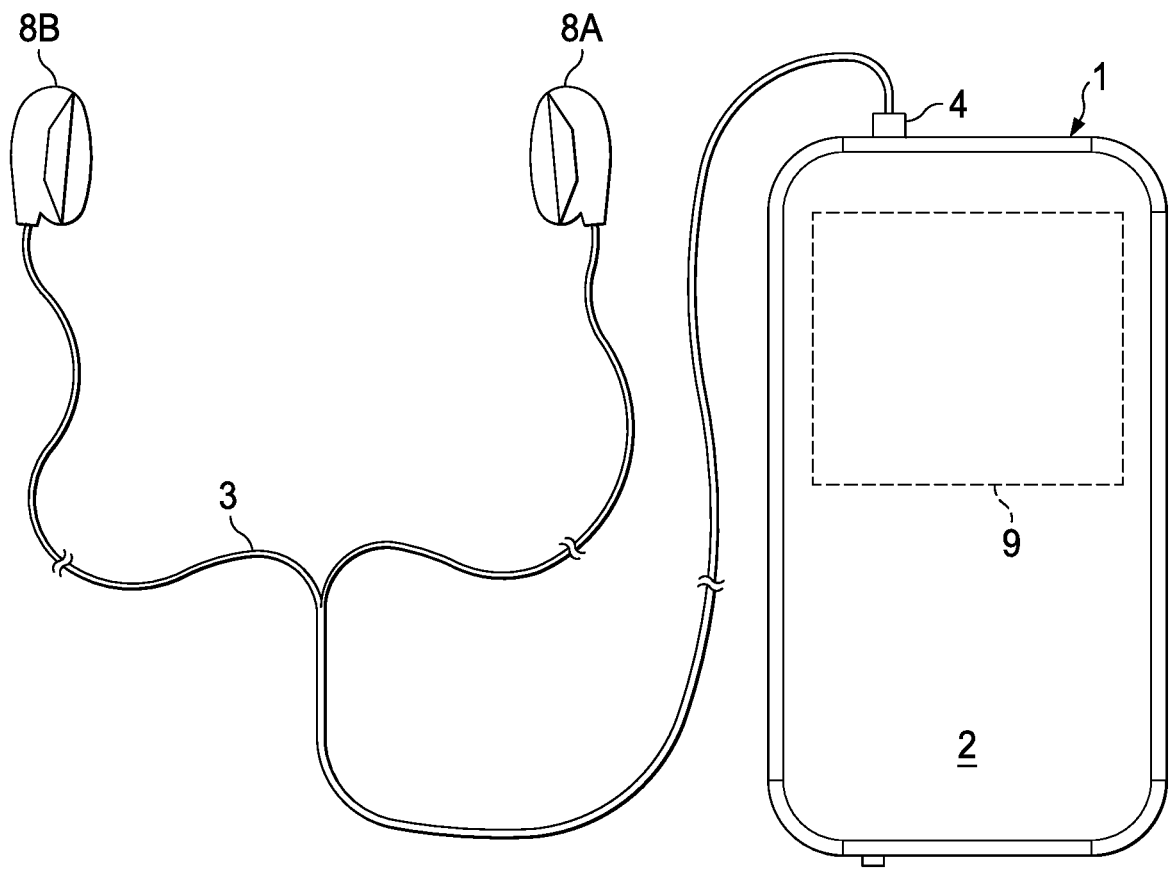
FIG. 1 illustrates an example personal audio device, in accordance with embodiments of the present disclosure.

FIG. 1 illustrates an example personal audio device 1, in accordance with embodiments of the present disclosure.

FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
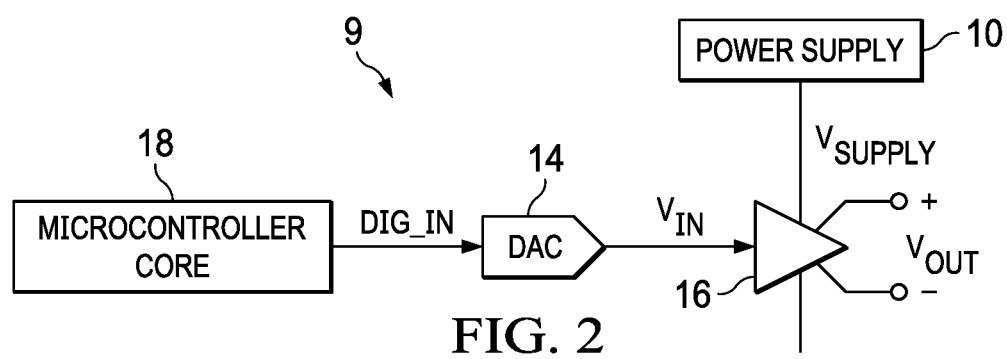
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a switched-mode power converter, as described in greater detail below. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
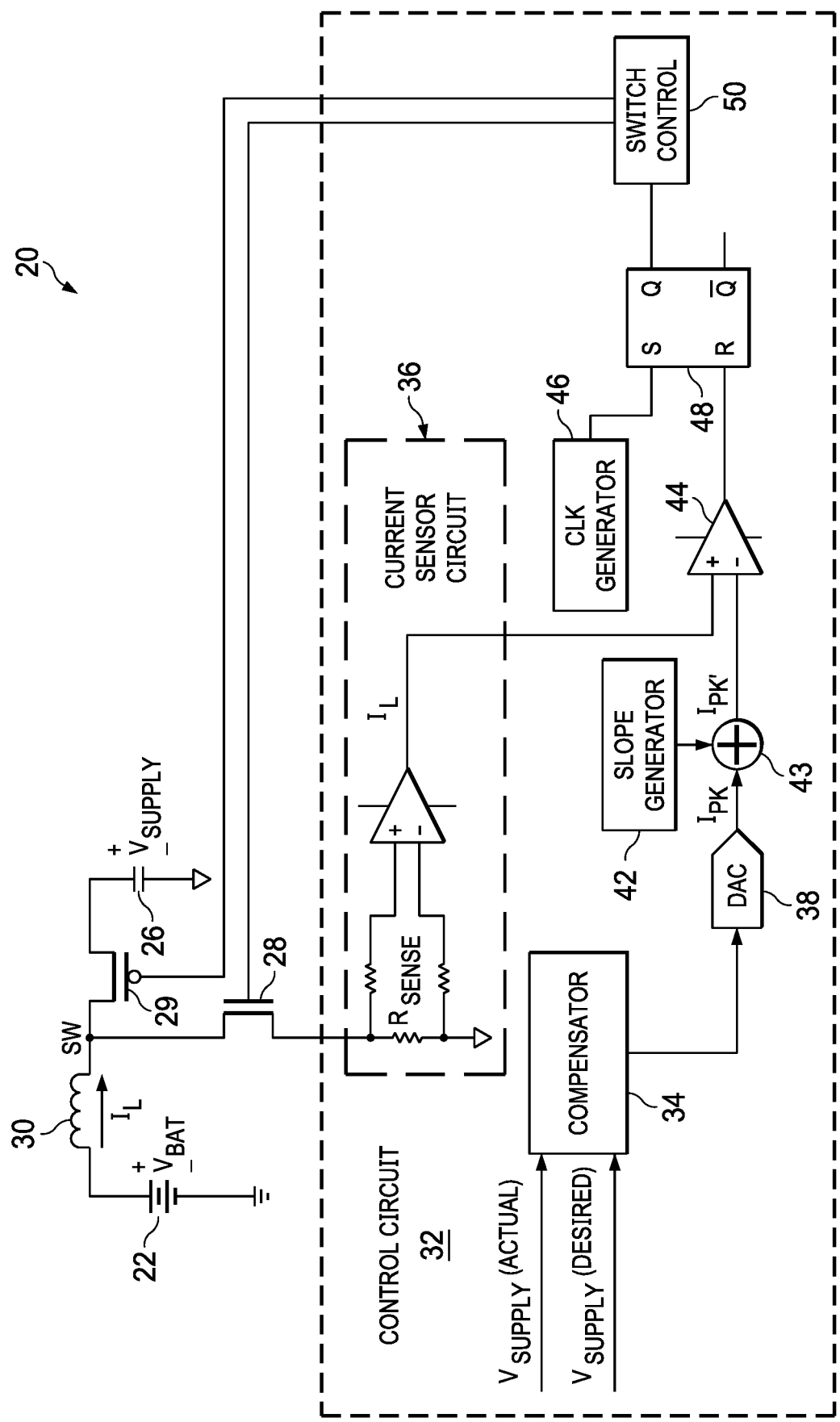
FIG. 3 illustrates a block diagram of selected components of an example peak-current control boost converter with peak current limit control which may be used to implement the power supply shown in FIG. 2, in accordance with embodiments of the present disclosure.

FIG. 3 illustrates a block diagram of selected components of an example peak-current controlled boost converter 20 which may be used to implement power supply 10 shown in FIG. 2, in accordance with embodiments of the present disclosure. As shown in FIG. 3, boost converter 20 may include a battery 22, a power inductor 30, a switch 28 implemented as an n-type metal-oxide-semiconductor field-effect transistor (NFET), a switch 29 implemented as a p-type metal-oxide-semiconductor field-effect transistor (PFET), and a control circuit 32.

In a first phase of a switching cycle of boost converter 20, control circuit 32 may cause switch 28 to be activated (e.g., closed, turned on, enabled) and switch 29 to be deactivated (e.g., opened, turned off, disabled). Thus, during the first phase, a switch node (labeled as "SW" in FIG. 3) may be effectively shorted to a ground potential, such that battery 22 applies its voltage $V_{BAT}$ across terminals of power inductor 30. As a result, an inductor current $I_L$ flowing in power inductor 30 may increase during the first phase. As described in greater detail below, control circuit 32 may cause inductor current $I_L$ to increase until such point that inductor current $I_L$ reaches a slope-compensated peak current limit $I_{PK}'$, at which the first phase may end.

In a second phase of the switching cycle of boost converter, control circuit 32 may cause switch 28 to be deactivated and switch 29 to be activated. As a result, inductor current $I_L$ may decrease during the second phase as power inductor 30 discharges into boost capacitor 26, boosting the supply voltage $V_{SUPPLY}$ to a voltage higher than battery voltage $V_{BAT}$. The second phase may continue until the end of the switching cycle, after which the first phase again occurs. In some embodiments, control circuit 32 may deactivate switch 29 during the second phase, such that a body diode of the PFET implementing switch 29 conducts inductor current $I_L$.

As shown in FIG. 3, control circuit 32 may include a compensator 34, current sensor circuit 36, a digital-to-analog converter (DAC) 38, a slope generator 42, a peak current comparator 44, a clock (CLK) generator 46, a latch 48, and switch control block 50.

In operation, the duty cycle of switch 28 (e.g., the duration of the first phase) control circuit 32 may determine the magnitude of supply voltage $V_{SUPPLY}$ relative to battery voltage $V_{BAT}$. For example, the duty cycle D needed to provide a desired supply voltage $V_{SUPPLY}$ may be given by $D=1-V_{BAT}/V_{SUPPLY}$. Thus, for a desired level of supply voltage $V_{SUPPLY}$ (e.g., which may be based on an envelope of an output signal of an amplifier), control circuit 32 may implement a feedback control loop, which may be internal to compensator 34, based on measured supply voltage $V_{SUPPLY}$ and measured inductor current $I_L$, which may be measured by current sensor circuit 36 (e.g., using a sense resistor with resistance $R_{SENSE}$; in some embodiments, $R_{SENSE}$ may have a resistance of approximately 10 me). Thus, control circuit 32 may monitor actual supply voltage $V_{SUPPLY}$, compare it against a desired supply voltage $V_{SUPPLY}$, and increase or decrease actual supply voltage $V_{SUPPLY}$ by increasing or decreasing the peak of inductor current $I_L$. In that vein, compensator 34 may generate a digital signal indicative of a desired peak current, and DAC 38 may convert such digital signal into an analog equivalent peak current signal $I_{PK}$. Slope generator 42 may generate a slope compensation signal. In some embodiments, slope generator 42 may generate the slope compensation signal as a triangle or sawtooth waveform. The slope compensation signal may be combined with peak current signal $I_{PK}$ to generate slope-compensated peak current signal $I_{PK}'$. Peak current comparator 44 may, during the first phase, compare a measured inductor current $I_L$ (e.g., measured by a current sensor circuit 36), generating a control signal responsive to the comparison. Together, the output of comparator 44, clock generator 46, and latch 48 may be arranged as shown, or arranged in another suitable manner, to generate a control signal to switch control block 50. For example, clock generator 46 may generate a clock signal indicating the beginning of a switching cycle (e.g., beginning of the first phase) and comparator 44 may, based on a point in which measured inductor current $I_L$ reaches slope-compensated peak current signal $I_{PK}'$, generate a signal indicating the end of the first phase. Based on such signals indicating timing of switch cycles and switch phases of boost converter 20, latch 48 may generate appropriate control signal(s) to switch control block 50, which may in turn generate appropriate control signals to switches 28 and 29 to accordingly selectively activate and deactivate switches 28 and 29.

Figure 4:
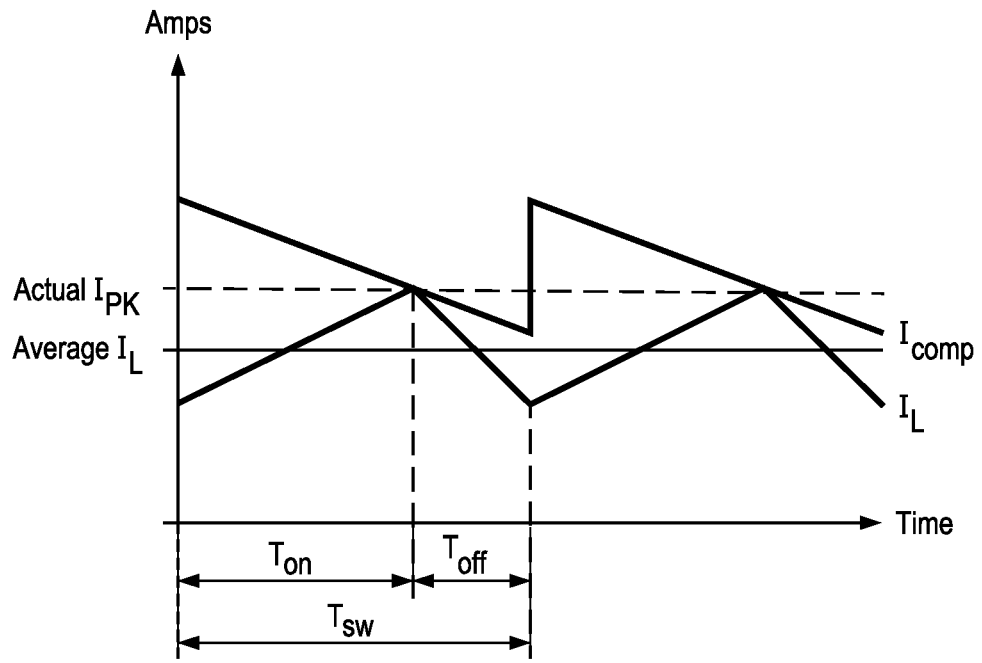
FIG. 4 illustrates graphs depicting example waveforms of inductor current and a slope compensation signal which illustrates the operating principle for slope compensation of a peak current controlled switched mode power supply, in accordance with embodiments of the present disclosure.

As disclosed above, boost converter 20 may employ a slope generator 42 for generating a slope compensation signal. FIG. 4 illustrates graphs depicting example waveforms of sensed inductor current $I_L$ and a slope compensation signal $I_{comp}$ which illustrates the operating principle for slope compensation of a peak current controlled switched mode power supply (e.g., such as boost converter 20), in accordance with embodiments of the present disclosure. In operation, each switching cycle of the peak current controlled switched mode power supply is started with a known timing reference and detects when the peak of the sensed inductor current $I_L$ crosses a threshold (e.g., as determined by comparator 44) during its energizing phase (e.g., in which switch 28 is activated and switch 29 is deactivated). The energizing phase is shown in FIG. 4 as having a duration of time $T_{on}$. At the point that the peak of the sensed inductor current $I_L$ crosses the threshold, the switched mode power supply may synchronously switch to its discharge phase (e.g., in which switch 28 is deactivated and switch 29 is activated) in which energy stored in inductor 30 may replenish charge in capacitor 26. The discharge phase is shown in FIG. 4 as having a duration of time $T_{off}$. Thus, slope compensation signal $I_{comp}$ serves effectively as a signal that, during each switching cycle, decreases from a known starting value to a known ending value, setting a peak current limit that decreases during the duration of a switching cycle.

Figure 5:
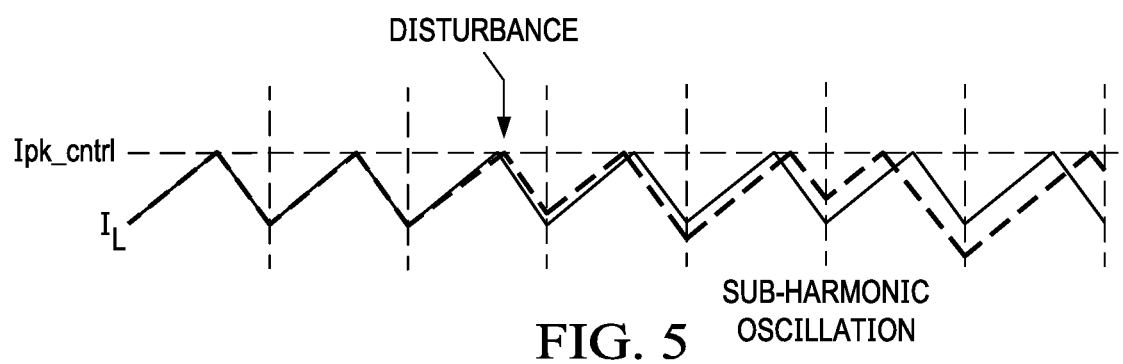
FIG. 5 illustrates graphs depicting example waveforms of inductor current which illustrates the operating principle for peak current controlled switched mode power supply without slope compensation, in accordance with embodiments of the present disclosure.

To further illustrate the desire for implementing slope compensation, reference is made to FIG. 5, which depicts unstable oscillation that may occur as a result of a sub-harmonic oscillation in the absence of slope compensation for duty cycles greater than 50%. FIG. 5 depicts with a solid line an ideal inductor current $I_L$ and with a dotted line an actual inductor current $I_L$ which may result from a disturbance introduced to such inductor current $I_L$ (e.g., via electrical noise). Such disturbance may cause actual inductor current $I_L$ to, in alternating cycles, reach peak current signal $I_{PK}$ too soon within a cycle or too late within a cycle, leading to an unstable sub-harmonic oscillation, and a situation in which a volt-second balance between adjacent cycles of boost converter 20 is not maintained.

Figure 6:
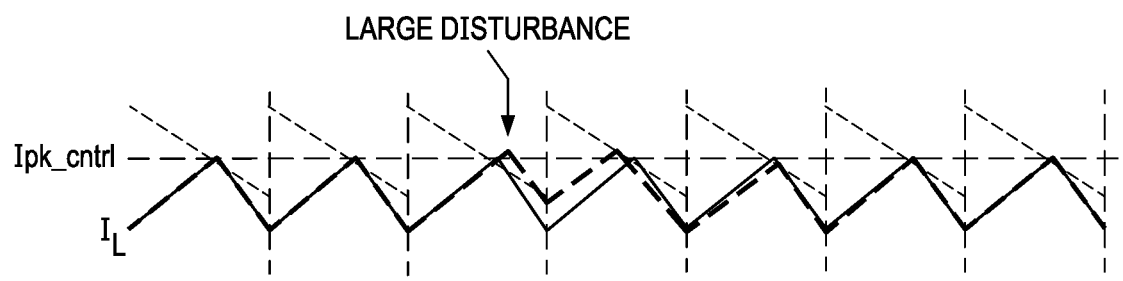
FIG. 6 illustrates graphs depicting example waveforms of inductor current and a slope compensation signal which further illustrates the operating principle for slope compensation of a peak current controlled switched mode power supply, in accordance with embodiments of the present disclosure.

As noted above, to overcome these problems and disadvantages, slope generator 42 may add a saw-tooth signal to the peak current signal $I_{PK}$ to generate slope-compensated peak current signal $I_{PK}'$ which may have the effect of biasing the current-control loop to the proper duty cycle. Thus, as shown in FIG. 6, during the energizing phase of boost converter 20, inductor current $I_L$ may increase until it reaches slope-compensated peak current signal $I_{PK}'$, and then decrease during the discharging phase of boost converter 20. The effect of slope-compensated peak current signal $I_{PK}'$ may be to lengthen the energizing phase in situations in which the energizing phase would last for less than the desired duty cycle in the absence of slope compensation, and to shorten the energizing phase in situations in which the energizing phase would last for more than the desired duty cycle in the absence of slope compensation.

However, slope compensation as depicted in FIG. 6 may have some disadvantages. Such slope compensation may negatively affect the dynamic range of compensator 34 and DAC 38, as the slope compensation signal adds a varying correction term that varies with duty cycle, further complicated by the fact that duty cycle may vary significantly in operation, and further complicated by the fact that if the slope-compensation term is non-zero at the point that inductor current $I_L$ reaches slope-compensated peak current signal $I_{PK}'$, compensator 34 and DAC 38 must remove the non-zero value to ensure accuracy. The slope compensation scheme in FIG. 6 may also have undesirable startup transients.

To overcome these and/or other disadvantages associated with implementing a slope compensated peak current controlled switched mode power converter, it may be desirable to generate a sawtooth ramp for slope compensation ramp $I_{ramp}$ with a cycle-by-cycle adaptable slope and a time-zero offset applied at the beginning of a switching cycle in order for the required slope to provide a zero crossing at a required duty cycle for the switched mode power converter, as described in greater detail below. These variable attributes for slope compensation ramp $I_{ramp}$ may result in a smooth start-up for the switched mode power converter, a peak current signal $I_{PK}$ that may accurately reflect an actual peak inductor current for each switching cycle, and relaxed dynamic range requirements for DAC 38.

Figure 7:
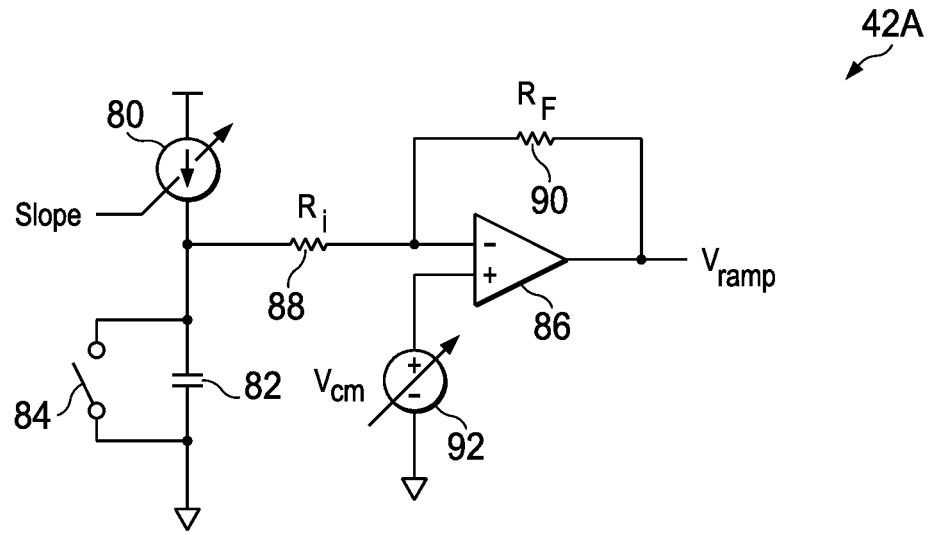
FIG. 7 illustrates a block diagram of selected components of an example sawtooth ramp generator that may provide a variable slope and a time-zero offset, in accordance with embodiments of the present disclosure.

FIG. 7 illustrates a block diagram of selected components of an example sawtooth ramp generator 42A that may approach the desired attributes of variable slope and time-zero offset, in accordance with embodiments of the present disclosure. In operation, example sawtooth ramp generator 42A may implement all or a part of slope generator 42 depicted in FIG. 3. As shown in FIG. 7, sawtooth ramp generator 42A may include a variable current source 80 having a variable current to define a slope for a ramp signal $V_{ramp}$ (which may be representative of or may be used to generate slope compensation ramp $I_{ramp}$), a capacitor 82 in series with variable current source 80, and a reset switch 84 in parallel with capacitor 82. Sawtooth ramp generator 42A may also include an amplifier comprising an operational amplifier 86, an input resistor 88 with input resistance $R_i$ coupled between an inverting input terminal of operational amplifier 86 and the output of variable current source 80, a feedback resistor 90 with feedback resistance $R_f$ coupled between the inverting terminal input terminal of operational amplifier 86 and an output terminal of operational amplifier 86, and a variable voltage source 92 coupled to the non-inverting input of operational amplifier 86 for generating a variable common-mode voltage $V_{cm}$. In operation, switch 84 may briefly activate at the beginning of each switching cycle to set a voltage across capacitor 82 to zero at the beginning of the switching cycle. During the switching cycle, variable current source 80 may increase the voltage across capacitor 82 with a slope proportional to the variable current generated by variable current source 80, which in turn causes ramp signal $V_{ramp}$ to decrease from a maximum voltage at the beginning of the switching cycle to common-mode voltage $V_{cm}$ in accordance with the slope.

Accordingly, sawtooth ramp generator 42A may operate in one of two ways based on a calculated duty cycle determined based on monitoring of an input voltage (e.g., battery voltage $V_{BAT}$) and an output voltage (e.g., supply voltage $V_{SUPPLY}$) for boost converter 20. As an example, for boost converter 20, a duty cycle D may be calculated as D=1−($V_{BAT}/V_{SUPPLY}$). The two ways sawtooth ramp generator 42A may operate include:

1. Setting common-mode voltage $V_{cm}$ for a given slope setting such that the zero crossing of common-mode voltage $V_{cm}$ occurs at the 50% duty cycle point of the switched mode power supply.

2. Setting common-mode voltage $V_{cm}$ for a given slope setting such that the zero crossing of common-mode voltage $V_{cm}$ occurs at an expected duty cycle of the switched mode power supply.

The first manner of operation may require a correction at the output of a compensator (e.g., compensator 34) to adjust for the actual duty cycle of the switched mode power supply. Such correction may reduce a dynamic range requirement and error of the peak current value $I_{PK}$ generated by DAC 38, but significant error may remain by using this approach. The second manner of operation may achieve optimal dynamic range for DAC 38 and minimal error in its estimate of peak current $I_{PK}$, but only for steady-state operation and fixed input/output voltage conditions.

Figure 8:
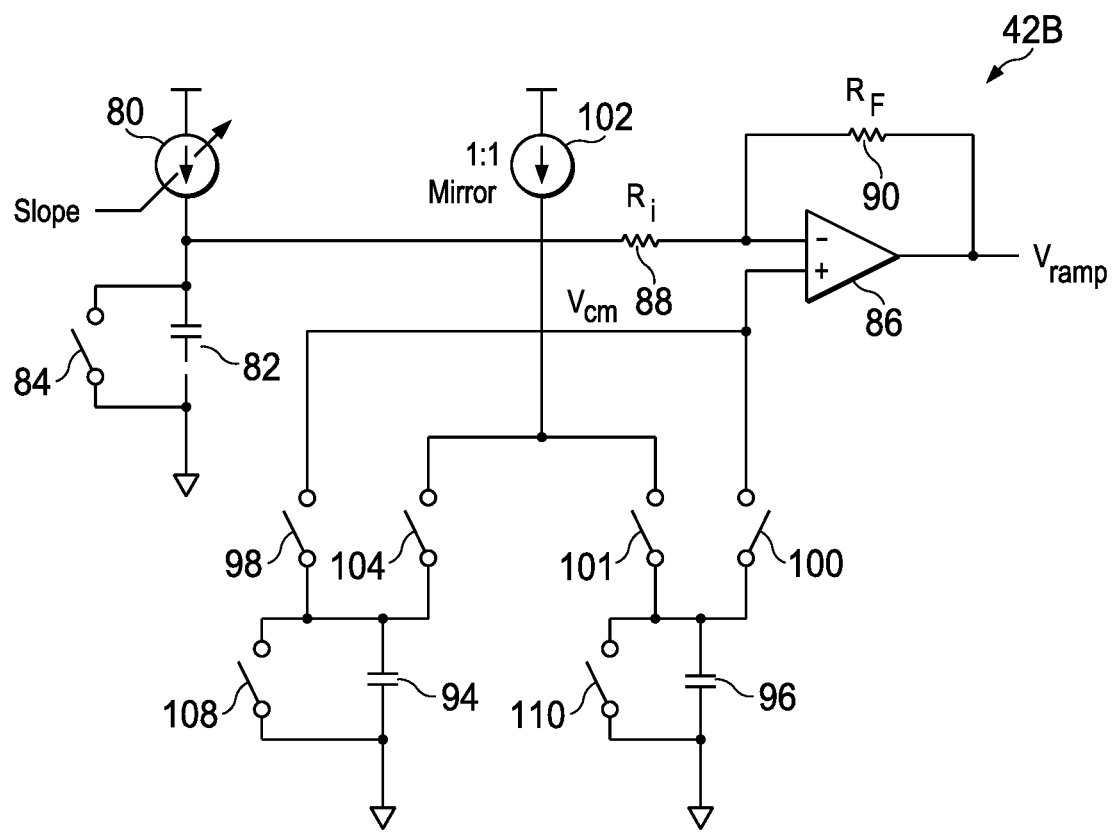
FIG. 8 illustrates a block diagram of selected components of an example sawtooth ramp generator that may automatically determine a time-zero offset needed for a minimal error zero crossing, in accordance with embodiments of the present disclosure.

Having to adjust a zero-crossing level of common-mode voltage $V_{cm}$ may leave unacceptable error in the switched mode power supply and/or may add more variables that must be managed in the switched mode power supply to achieve minimal slope compensation error. It may be desired to only set the slope and let the slope compensation generation circuit automatically determine a time-zero offset as needed for the minimal error zero crossing. Such automatic determination may eliminate the need for adjusting the zero crossing via the reference adjustment of common-mode voltage $V_{cm}$ used in the second manner of operation for sawtooth ramp generator 42A described above. Such automatic determination may also eliminate error in the peak current value $I_{PK}$ generated on a cycle-by-cycle basis. FIG. 8 illustrates a block diagram of selected components of an example sawtooth ramp generator 42B that may perform such automatic determination, in accordance with embodiments of the present disclosure. In operation, example sawtooth ramp generator 42B may implement all or a part of slope generator 42 depicted in FIG. 3.

In other words, FIG. 8 depicts a sawtooth ramp generator 42B for applying a variable common-mode $V_{cm}$ and slope for the sawtooth ramp. Such slope may be determined in any suitable manner. For example, in some embodiments, control circuit 32 may perform a feedforward calculation of the duty cycle by measurement of battery voltage $V_{BAT}$ and supply voltage $V_{SUPPLY}$. Together, these measured voltages may be used to determine the appropriate slope and the time at which a zero-crossing should occur.

Example sawtooth ramp generator 42B depicted in FIG. 8 may be identical in many respects to example sawtooth ramp generator 42A of FIG. 7, and thus, only the material differences between example sawtooth ramp generator 42B and example sawtooth ramp generator 42A are described in detail. As compared to example sawtooth ramp generator 42A of FIG. 7, example sawtooth ramp generator 42B of FIG. 8 may include the use of two additional capacitors 96 in a ping-pong fashion for setting common-mode voltage $V_{cm}$. In a first switching cycle, capacitor 94 may be coupled to the non-inverting terminal of operational amplifier 86 (e.g., via switch 98 when switch 98 is activated), and capacitor 96 may be precharged (e.g., via switch 106 when switch 106 is activated) from current source 102 which may be a current mirror of variable current source 80. Thus, capacitor 94 may be precharged with the same integrating current source over the same duration as capacitor 82. In a second switching cycle (operation may alternate between the first switching cycle and the second switching cycle), capacitor 96 may be coupled to the non-inverting terminal of operational amplifier 86 (e.g., via switch 100 when switch 100 is activated), and capacitor 94 may be precharged (e.g., via switch 104 when switch 104 is activated) from current source 102 which, as noted above, may be a current mirror of variable current source 80. Thus, capacitor 96 may be precharged with the same integrating current source over the same duration as capacitor 82. Accordingly, when current source 102 is a simple mirror of 80, common-mode voltage $V_{cm}$ may be determined by the on time of current source 102 (e.g., which may be related to the duty cycle of boost converter 20). For example, if current source 102 is active (via the switches below called "pre"), then capacitor 94 may be precharged for the on time of switch 28 in FIG. 3, using the same current level that may be used to discharge capacitor 94 in the next switching period, so that the starting point for capacitor 94 in each switching cycle may ensure that a zero crossing occurs at the end of the on time of switch 28 in the next switching cycle, assuming steady state behavior.

During a switching cycle when capacitor 94 is precharged, a reset switch 108 in parallel with capacitor 94 may be briefly activated to discharge capacitor 94 to zero volts. Likewise, during a switching cycle when capacitor 96 is precharged, a reset switch 110 in parallel with capacitor 96 may be briefly activated to discharge capacitor 96 to zero volts. Such reset-and-pre-charge operation of capacitors 94 and 96 may result in an automatic setting of the common-mode voltage $V_{cm}$, and thus an automatic setting of a time-zero offset and resulting zero crossing for ramp signal $V_{ramp}$ for a given setting of the slope by the variable current of variable current source 80.

Figure 9:
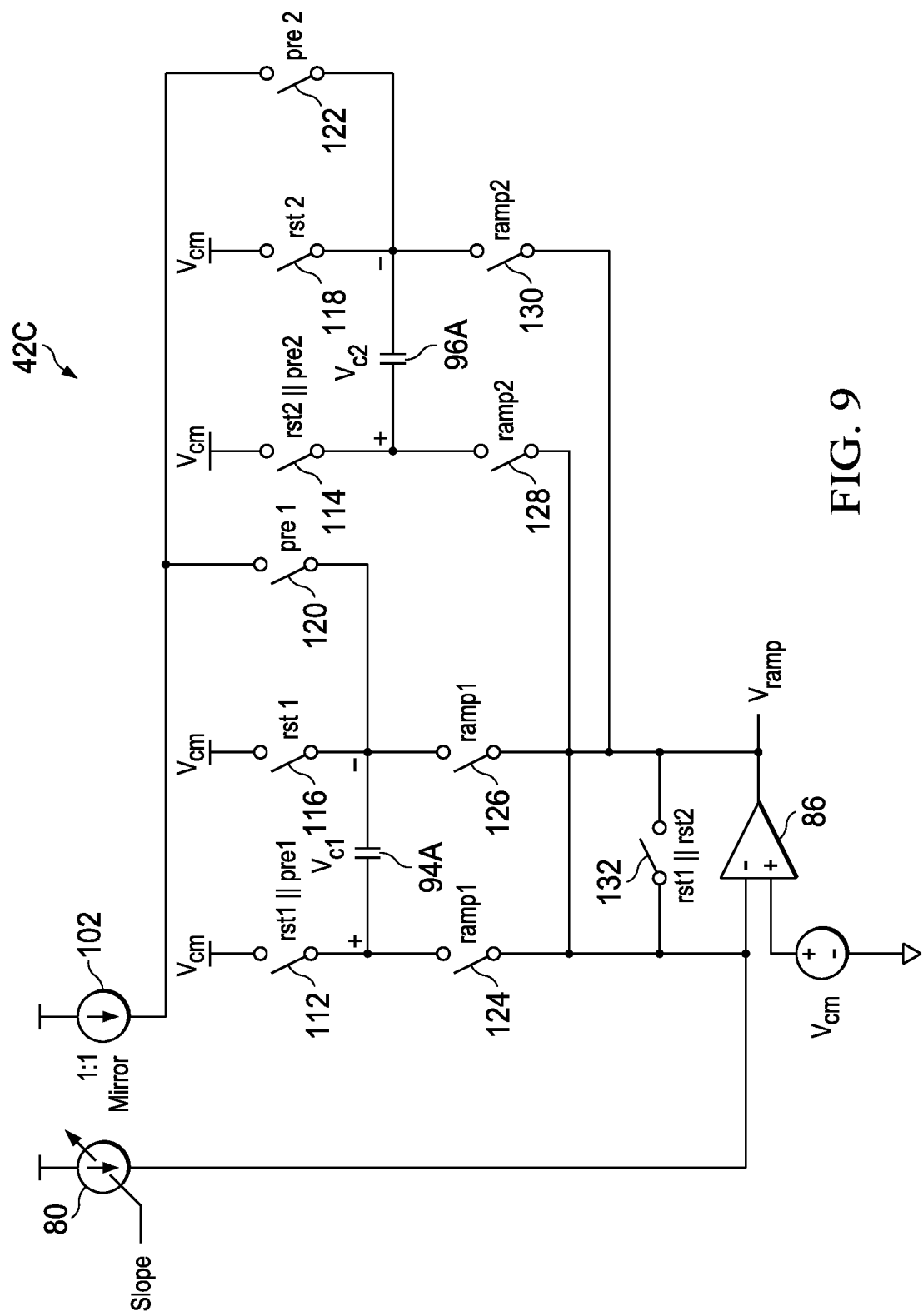
FIG. 9 illustrates a block diagram of selected components of an example sawtooth ramp generator utilizing its amplifier as an active integrator, in accordance with embodiments of the present disclosure.

FIG. 9 illustrates a block diagram of selected components of an example sawtooth ramp generator 42C utilizing its amplifier as an active integrator, in accordance with embodiments of the present disclosure. In operation, example sawtooth ramp generator 42C may implement all or a part of slope generator 42 depicted in FIG. 3. Example sawtooth ramp generator 42C depicted in FIG. 9 may be identical in many respects to example sawtooth ramp generator 42B of FIG. 8, and thus, only the material differences between example sawtooth ramp generator 42C and example sawtooth ramp generator 42B are described in detail. One material difference is that in example sawtooth ramp generator 42C, the amplifier is used as an active integrator, and thus only two capacitors 94A and 96A (instead of the three required in example sawtooth ramp generator 42B) are needed to implement the optimal slope compensation circuit, which thus may require a smaller physical space as compared to example sawtooth ramp generator 42B. The solution of example sawtooth ramp generator 42C may also eliminate a signal-dependent common-mode shift on the inputs of operational amplifier 86.

Figure 10:
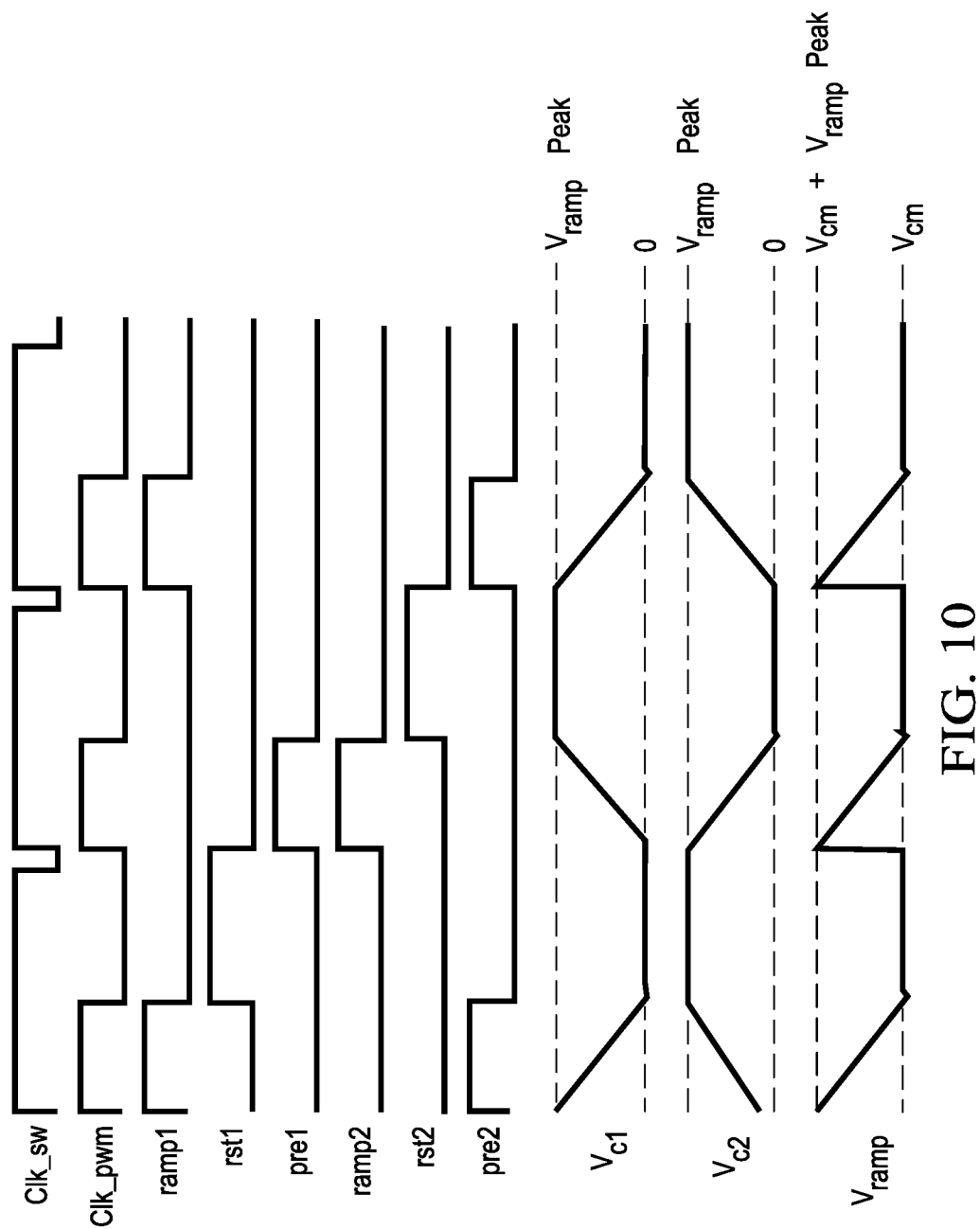
FIG. 10 illustrates a timing diagram of various switch control signals, clock control signals, and resultant voltage waveforms for the example sawtooth ramp generator shown in FIG. 9, in accordance with embodiments of the present disclosure.

FIG. 10 illustrates a timing diagram of various switch control signals (e.g., ramp1, rst1, pre1, ramp2, rst2, pre2) and resultant voltage waveforms for a voltage $V_{c1}$ across capacitor 94A, voltage $V_{c2}$ across capacitor 96A, and ramp signal $V_{ramp}$, in accordance with embodiments of the present disclosure. FIG. 10 also depicts an example clock signal Clk_sw defining a switching period for a switched mode power source, and a clock signal Clk_pwm defining a pre-charging period for pre-charging capacitors 94A and 96A. As depicted in FIG. 9, example sawtooth ramp generator 42C may include a plurality of switches 112, 114, 116, 118, 120, 122, 124, 126, 128, 130, and 132 arranged as shown and wherein:

Switch 112 may be active when either of control signal rst1 or control signal pre1 is asserted;
Switch 114 may be active when either of control signal rst2 or control signal pre2 is asserted;
Switch 116 may be active when control signal rst1 is asserted;
Switch 118 may be active when control signal rst2 is asserted;
Switch 120 may be active when control signal pre1 is asserted;
Switch 122 may be active when control signal pre2 is asserted;
Switch 124 may be active when control signal ramp1 is asserted;
Switch 126 may be active when control signal ramp1 is asserted;
Switch 128 may be active when control signal ramp2 is asserted;
Switch 130 may be active when control signal ramp2 is asserted; and
Switch 132 may be active when either of control signal rst1 or control signal rst2 is asserted.

Similar to example sawtooth ramp generator 42B, example sawtooth ramp generator 42C may use two integrating capacitors 94A and 96A in a ping-pong fashion. When capacitor 94A is coupled between the inverting input terminal and output terminal of operation amplifier 86 to generate ramp signal $V_{ramp}$, capacitor 96A may be pre-charged using an equal current source (e.g., current source 102) over the same duration as the current ramp time. Capacitor 96A may then be coupled between the inverting input terminal and output terminal of operation amplifier 86 to generate ramp signal $V_{ramp}$ in the subsequent switching cycle while capacitor 94A is reset then pre-charged. As in example sawtooth ramp generator 42B, in example sawtooth ramp generator 42C, the reset-and-pre-charge operation of capacitors 94A and 96A may result in an automatic setting of the common-mode voltage $V_{cm}$, and thus an automatic setting of a time-zero offset and resulting zero crossing for ramp signal $V_{ramp}$ for a given setting of the slope by the variable current of variable current source 80.

Example sawtooth ramp generators 42A, 42B, and 42C may allow three options for setting a time-zero offset and ramp signal $V_{ramp}$ zero crossing to achieve minimal error adaptive slope compensation in a peak current controlled switched mode power supply. The choice among such options may involve trade-offs in performance versus complexity. In some instances, a combination of all three options may be used as needed to meet various system-level requirements. Such options are described in detail below.

Figure 11:
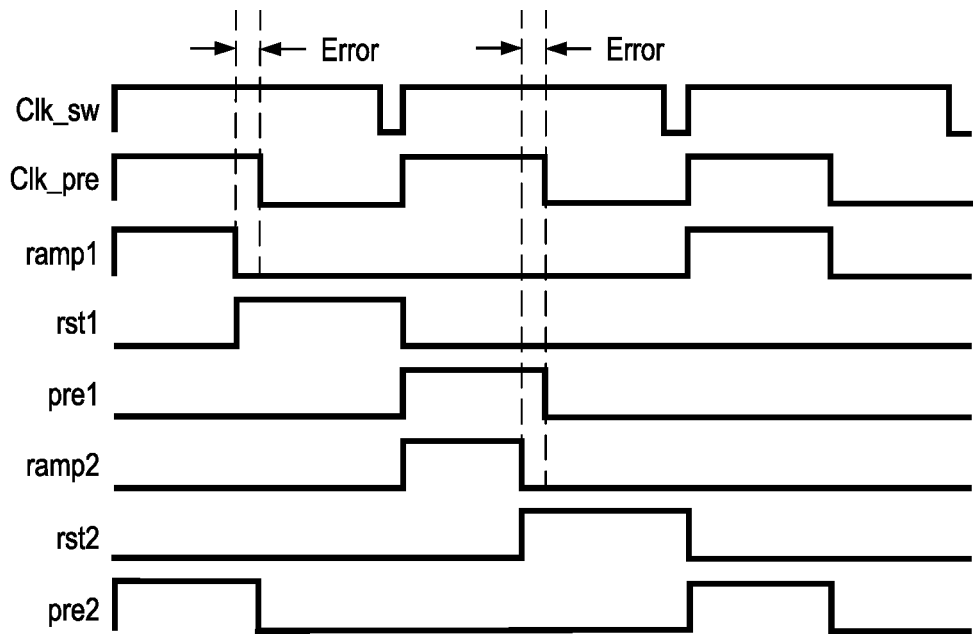
FIG. 11 illustrates a timing diagram of various switch control signals, clock control signals, and resultant voltage waveforms for the example sawtooth ramp generator shown in FIG. 9 with precharging that assumes a fixed duty cycle, in accordance with embodiments of the present disclosure.

For the first option, as shown in the timing diagram of FIG. 11, a static configuration may be utilized to set a zero crossing of ramp signal $V_{ramp}$ at a fixed duty cycle (e.g., 50%). As shown in FIG. 11, a pre-charge time may be set by clock signal Clk_pre, which is depicted as being set to 50% duty cycle in the example of FIG. 11. However, the example of FIG. 11 also depicts that the actual duty cycle is lower than 50%. A timing error indicated in the diagram as "Error" may result that must be corrected for at the output of DAC 38 in order to achieve the actual duty cycle zero crossing.

Figure 12:
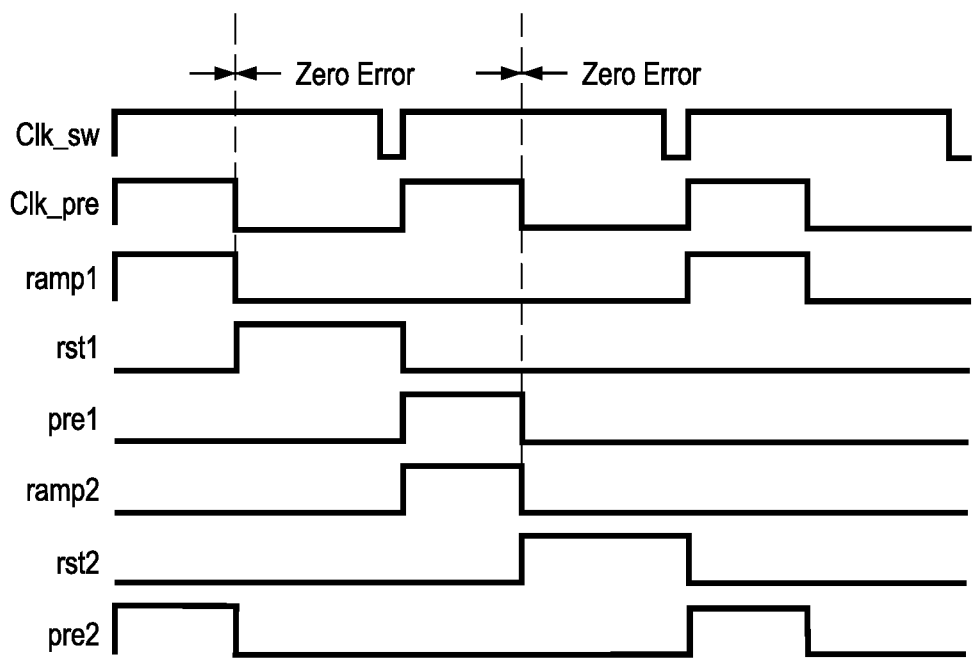
FIG. 12 illustrates a timing diagram of various switch control signals, clock control signals, and resultant voltage waveforms for the example sawtooth ramp generator shown in FIG. 9 with precharging that utilizes a quasi-static duty cycle, in accordance with embodiments of the present disclosure.

For the second option, as shown in the timing diagram of FIG. 12, a quasi-static configuration may be utilized to set a zero crossing of ramp signal $V_{ramp}$ at the expected duty cycle for the switched mode power supply. In this case, an expected duty cycle may be set by control circuitry (not explicitly shown in the FIGURES), and as noted above, may be calculated based on an input voltage and output voltage of the switched mode power supply (e.g., for boost converters 20. duty cycle D may be calculated as $D=1-(V_{BAT}/V_{SUPPLY})$). The pre-charge time may be by clock signal Clk_pre, which may be set to the expected steady-state duty cycle calculated as described. FIG. 12 depicts a scenario in which the expected duty cycle matches the actual steady-state duty cycle resulting in zero timing error for the zero crossing of ramp signal $V_{ramp}$. Zero error in the approximation may be approached by employing a delta-sigma loop (not explicitly shown in the FIGURES) to accurately set the expected duty cycle over multiple cycles.

For the second option, as shown in the timing diagram of previously-described FIG. 10, a self auto-calibration may be utilized to set a zero crossing of ramp signal $V_{ramp}$ at the duty cycle for the switched mode power supply based on the duty cycle of at least one or more previous switching cycles. As shown in FIG. 10, the pre-charge phase defined by clock signal Clk_pwm may be equal in duration to the energizing phase of the power inductor of the switched mode power supply (e.g., inductor 30) to give a minimal error in the zero crossing of ramp signal $V_{ramp}$. In this case, the pre-charge time may be set by a pulse-width modulated signal derived from an actual pulse-width modulation control signal used to drive the switched mode power supply.

Figure 13:
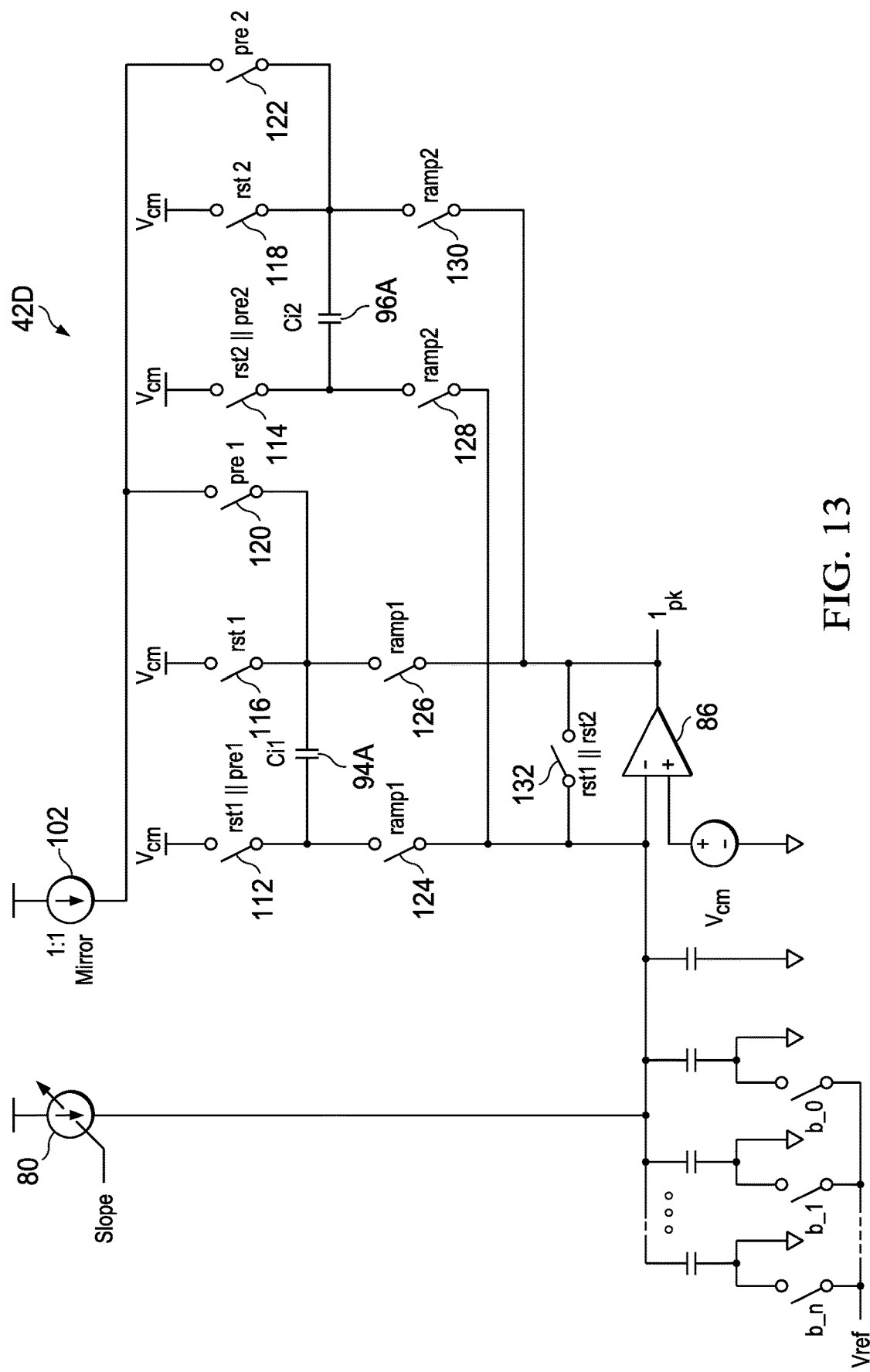
FIG. 13 illustrates a block diagram of selected components of an example circuit with a sawtooth ramp generator utilizing its amplifier as an active integrator, a digital-to-analog converter, and an analog summer, in accordance with embodiments of the present disclosure.

FIG. 13 illustrates a block diagram of selected components of an example circuit 42D combining into a single circuit a sawtooth ramp generator utilizing its amplifier as an active integrator, a digital-to-analog converter, and an analog summer, in accordance with embodiments of the present disclosure. Referring back to FIG. 3, three separate building blocks are used to generate the slope-compensated peak current control signal $I_{PK}'$: DAC 38, slope generator 42 (with ramp generator), and an analog summer 43. As shown in FIG. 13, circuit 42D may combine a DAC 38 having multiple DAC elements 134, sawtooth ramp generator 42C of FIG. 9, and summer 43 (effectively implemented by the electrical node of the inverting input of operational amplifier 86) into a single circuit.

Figure 14:
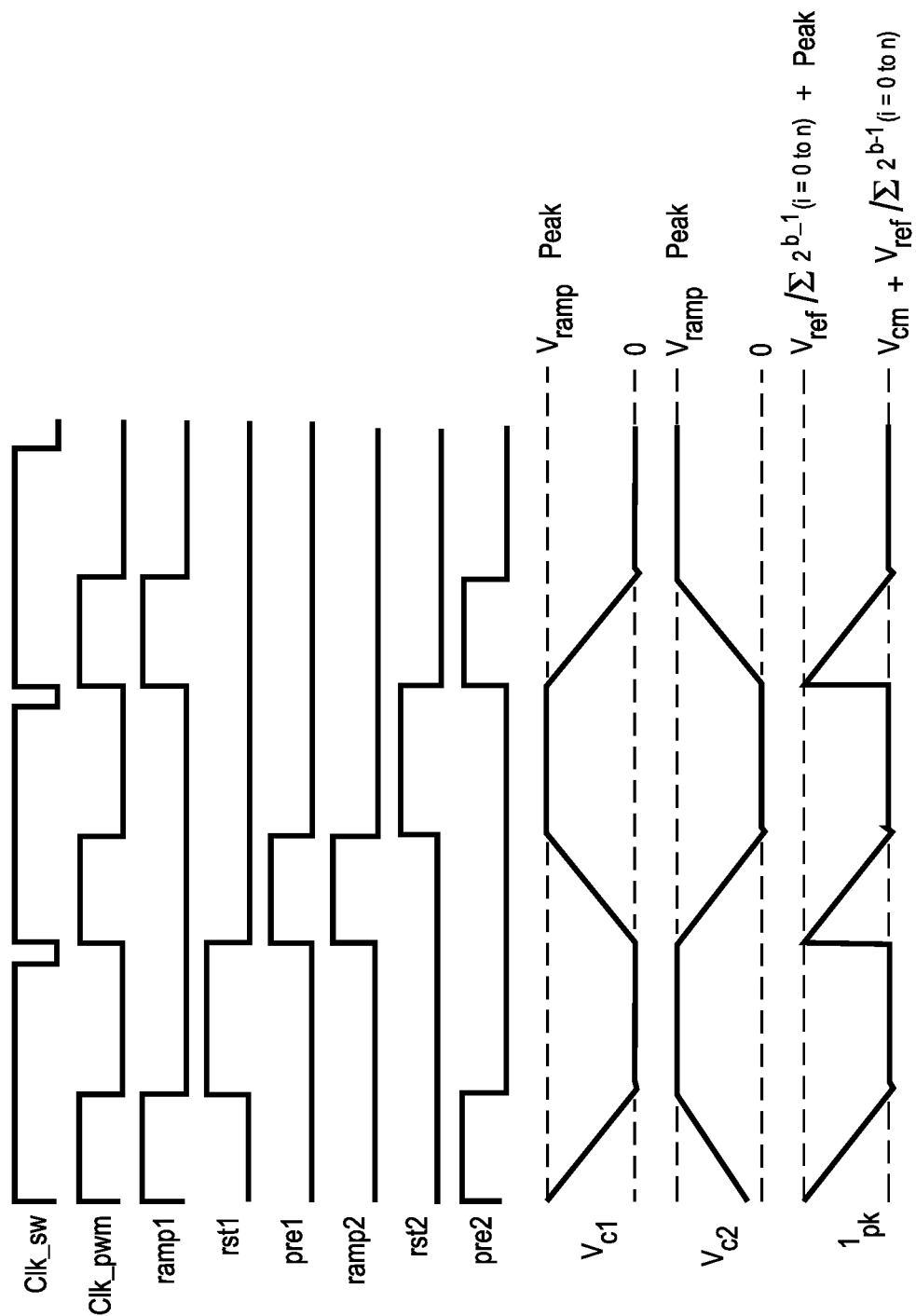
FIG. 14 illustrates a timing diagram of various switch control signals, clock control signals, and resultant voltage waveforms for the example circuit shown in FIG. 13, in accordance with embodiments of the present disclosure.

FIG. 14 illustrates a timing diagram of various switch control signals (e.g., ramp1, rst1, pre1, ramp2, rst2, pre2) and resultant voltage waveforms for voltage $V_{c1}$ across capacitor 94A, voltage $V_{c2}$ across capacitor 96A, and slope-compensated peak current control signal $I_{PK}'$, in accordance with embodiments of the present disclosure. FIG. 14 also depicts an example clock signal Clk_sw defining a switching period for a switched mode power source, and a clock signal Clk_pwm defining a pre-charging period for pre-charging capacitors 94A and 96A.

Although the foregoing contemplates use of current mirrors as current sources, other suitable approaches may be used to implement sawtooth ramp generators 42A-42C.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

An examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
   controlling switching behavior of switches of a switch-mode power supply based on a desired physical quantity associated with the switch-mode power supply, wherein the desired physical quantity is based at least in part on a slope compensation signal; and
   generating the slope compensation signal to have a compensation value of approximately zero at an end of a duty cycle of operation of the switch-mode power supply, wherein generating the slope compensation signal includes causing the slope compensation to have a starting value at a beginning of each duty cycle by configuring the starting value over one or more switching cycles of the switch-mode power supply.

2. The method of claim 1, wherein generating the slope compensation signal includes causing the slope compensation to have a starting value at a beginning of the duty cycle based on an assumption that the switch-mode power supply has a fifty-percent duty cycle.

3. The method of claim 1, wherein generating the slope compensation signal includes setting a starting value for a switching cycle of the switch-mode power supply based on a duty cycle of one or more previous switching cycles of the switch-mode power supply.

4. The method of claim 1, wherein generating the slope compensation signal includes setting a starting value for a switching cycle of the switch-mode power supply based on calculations for determining the duty cycle.

5. The method of claim 4, wherein the calculations for determining the duty cycle are based on a supply voltage to and an output voltage generated by the switch-mode power supply.

6. The method of claim 1, wherein generating the slope compensation signal includes using control signals associated with the switch-mode power supply to modify one or more previous switching cycles of the switch-mode power supply prior to a switching cycle of the switch-mode power supply in order to set the starting value for the switching cycle.

7. The method of claim 1, wherein the desired physical quantity is a peak current associated with the switch-mode power supply.

8. The method of claim 1, wherein the desired physical quantity is a peak current associated with an inductor of the switch-mode power supply.

9. A system comprising:
control circuitry configured to control switching behavior of switches of a switch-mode power supply based on a desired physical quantity associated with the switch-mode power supply, wherein the desired physical quantity is based at least in part on a slope compensation signal; and
a slope generator configured to generate the slope compensation signal to have a compensation value of approximately zero at an end of a duty cycle of operation of the switch-mode power supply, wherein generating the slope compensation signal includes causing the slope compensation to have a starting value at a beginning of each duty cycle by configuring the starting value over one or more switching cycles of the switch-mode power supply.

10. The system of claim 9, wherein generating the slope compensation signal includes causing the slope compensation to have a starting value at a beginning of the duty cycle based on an assumption that the switch-mode power supply has a fifty-percent duty cycle.

11. The system of claim 9, wherein generating the slope compensation signal includes setting a starting value for a switching cycle of the switch-mode power supply based on a duty cycle of one or more previous switching cycles of the switch-mode power supply.

12. The system of claim 9, wherein generating the slope compensation signal includes setting a starting value for a switching cycle of the switch-mode power supply based on calculations for determining the duty cycle.

13. The system of claim 12, wherein the calculations for determining the duty cycle are based on a supply voltage to and an output voltage generated by the switch-mode power supply.

14. The system of claim 9, wherein generating the slope compensation signal includes using control signals associated with the switch-mode power supply to modify one or more previous switching cycles of the switch-mode power supply prior to a switching cycle of the switch-mode power supply in order to set the starting value for the switching cycle.

15. The system of claim 9, wherein the desired physical quantity is a peak current associated with the switch-mode power supply.

16. The system of claim 9, wherein the desired physical quantity is a peak current associated with an inductor of the switch-mode power supply.

* * * * *